United States Patent [19]

DeBell

[11] Patent Number: 4,813,014
[45] Date of Patent: Mar. 14, 1989

[54] DIGITAL AUDIO MEMORY SYSTEM
[75] Inventor: Lawrence R. DeBell, Bethany, Okla.
[73] Assignee: Phi Technologies, Inc., Oklahoma City, Okla.
[21] Appl. No.: 851,453
[22] Filed: Apr. 14, 1986
[51] Int. Cl.[4] .................. G11C 27/00; G11C 8/00
[52] U.S. Cl. ................................ 365/45; 360/32;
365/52; 365/230; 379/88
[58] Field of Search .............. 365/45, 189, 52, 230;
360/32; 364/200 MS File, 900 MS File;
379/88; 375/27

[56] References Cited
U.S. PATENT DOCUMENTS

| 4,389,541 | 6/1983 | Nakano et al. | 381/36 |
|---|---|---|---|
| 4,549,047 | 10/1985 | Brian et al. | 379/88 |
| 4,616,110 | 10/1986 | Hashimoto | 379/88 |
| 4,656,605 | 4/1987 | Clayton | 365/189 |
| 4,663,777 | 5/1987 | Szeto | 379/88 |

FOREIGN PATENT DOCUMENTS

| 0055597 | 4/1982 | Japan | 365/45 |
|---|---|---|---|
| 2130025 | 5/1984 | United Kingdom | 365/52 |

Primary Examiner—Stuart N. Hecker
Assistant Examiner—Glenn A. Gossage
Attorney, Agent, or Firm—Laney, Dougherty, Hessin & Beavers

[57] ABSTRACT

A method and apparatus for rapid access digital storage and playback of audio information that consists of a large array of solid state random access memory devices connected in a basic multi-group, multi-card, multi-unit configuration that is addressable in one second increments for a selected duration. Storage or playback with requisite signal conversion may be effected by inputting real time decimal address indications to select a designated time and duration of the total memory capacity.

22 Claims, 9 Drawing Sheets

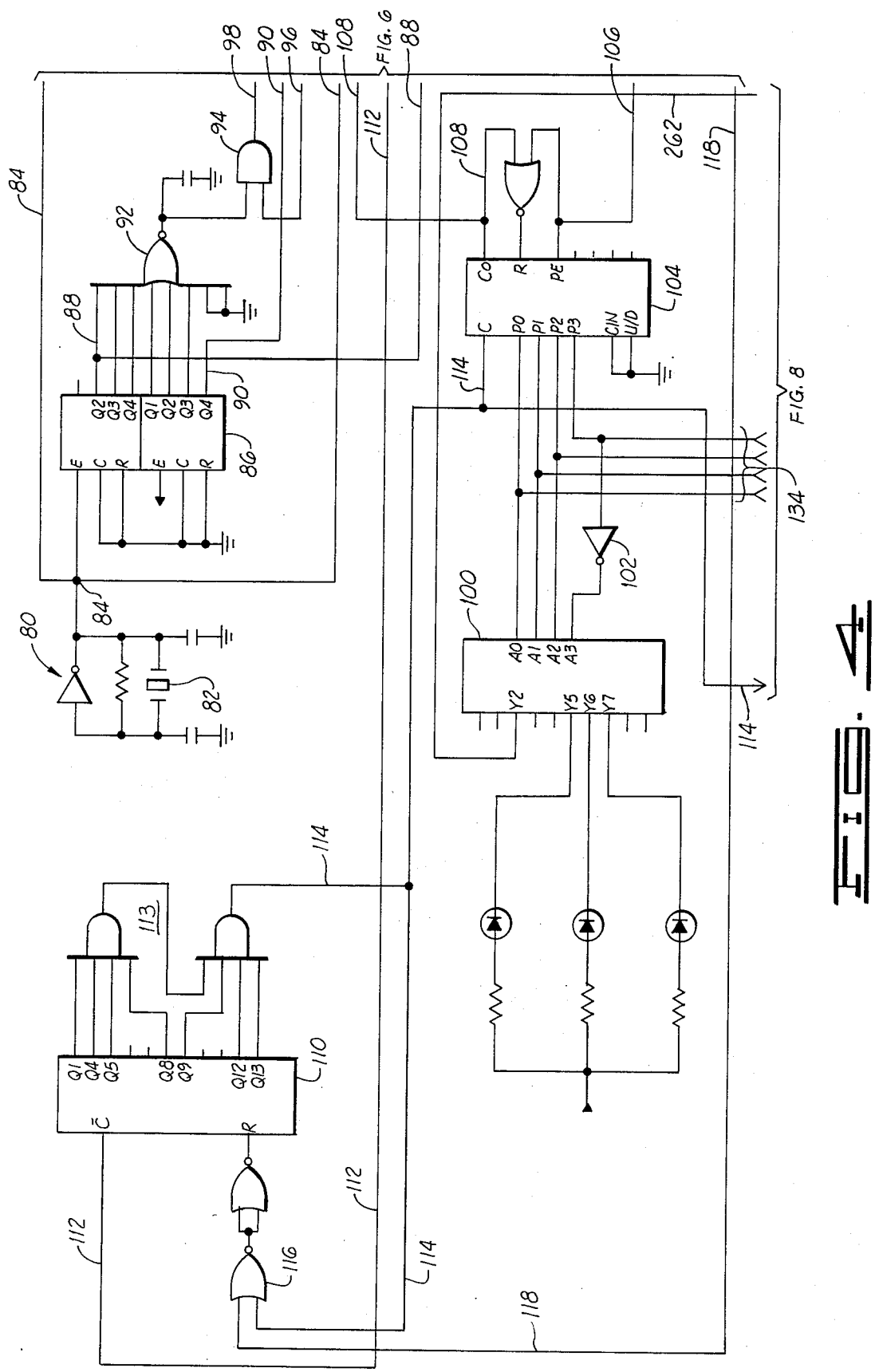

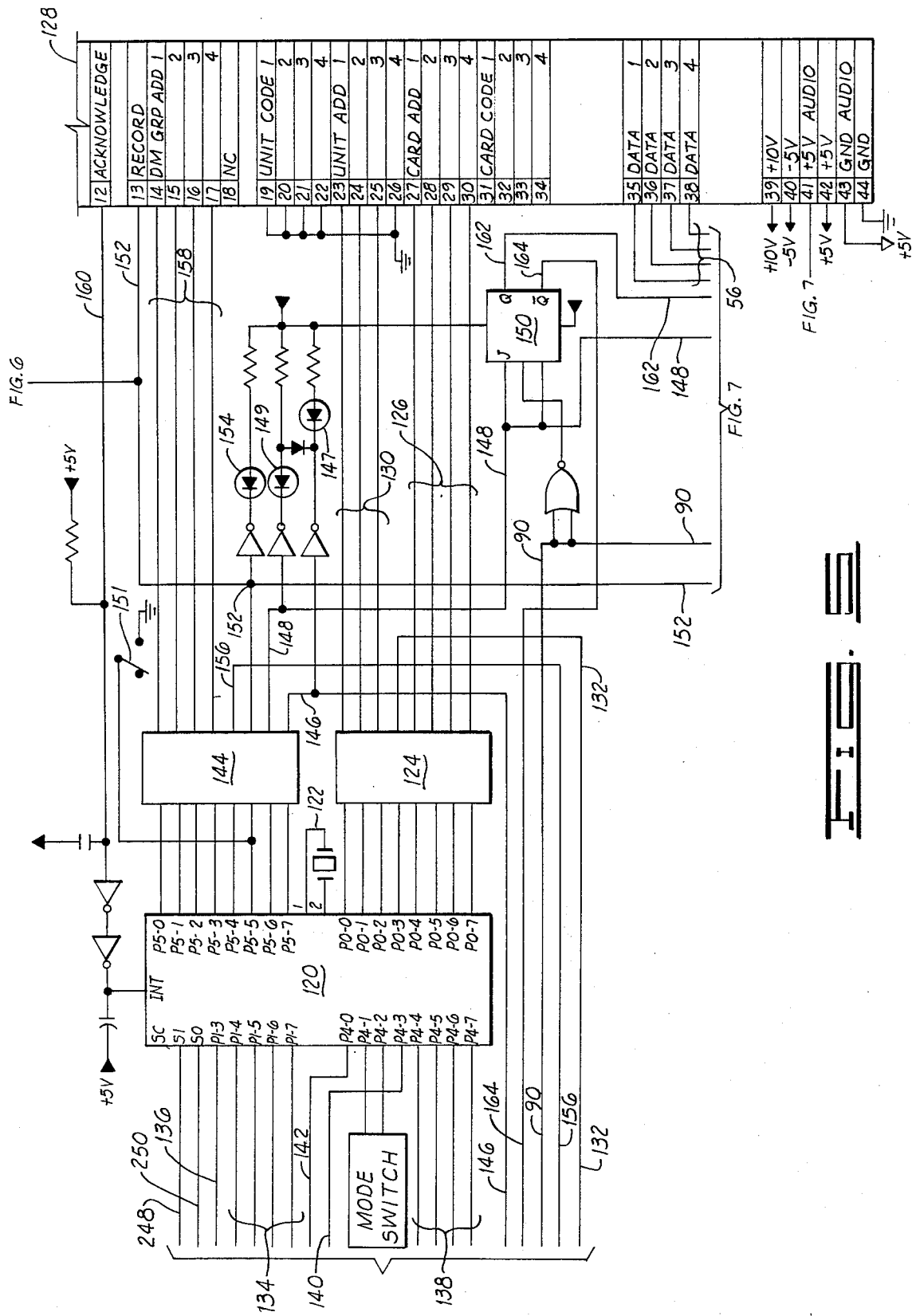

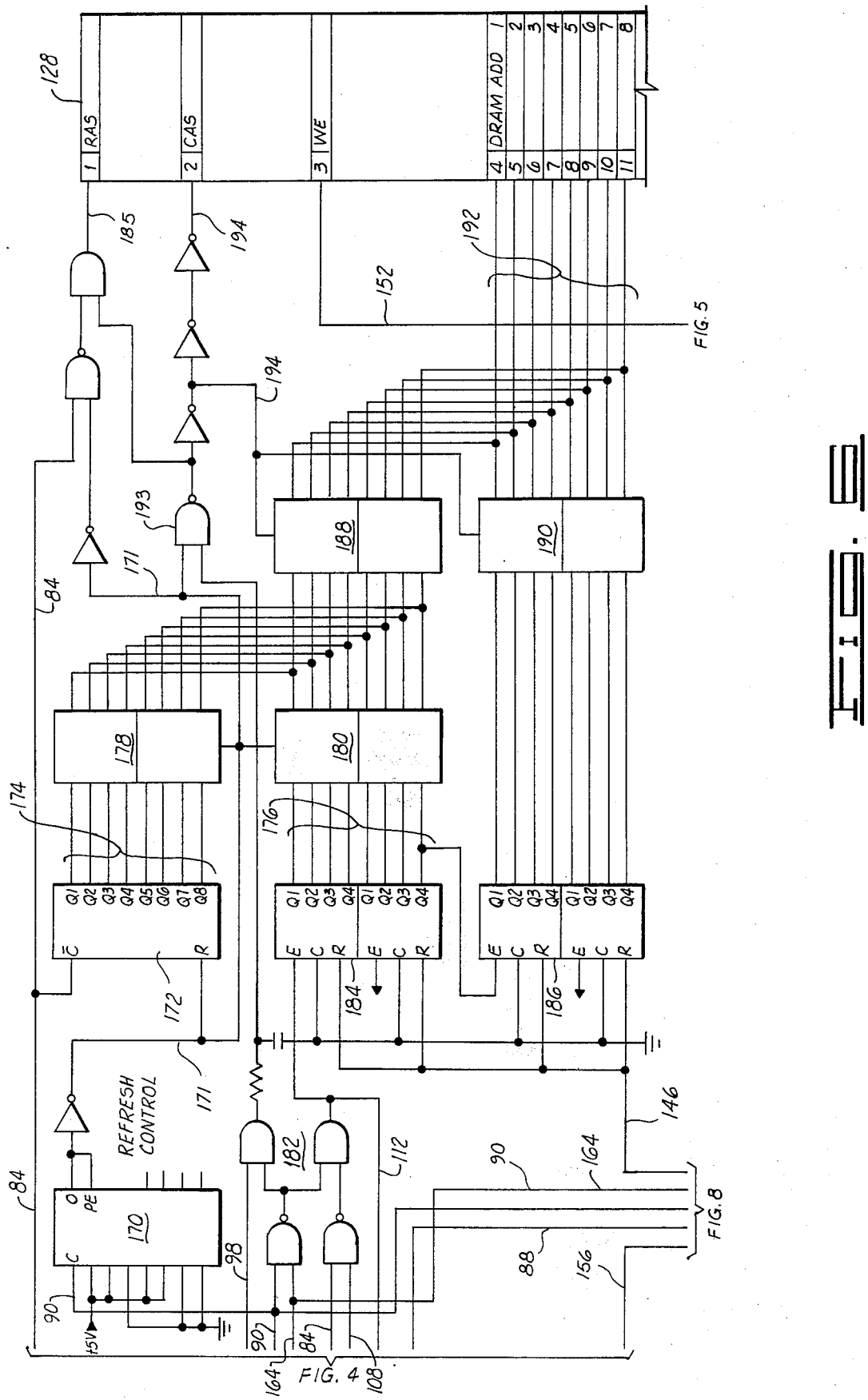

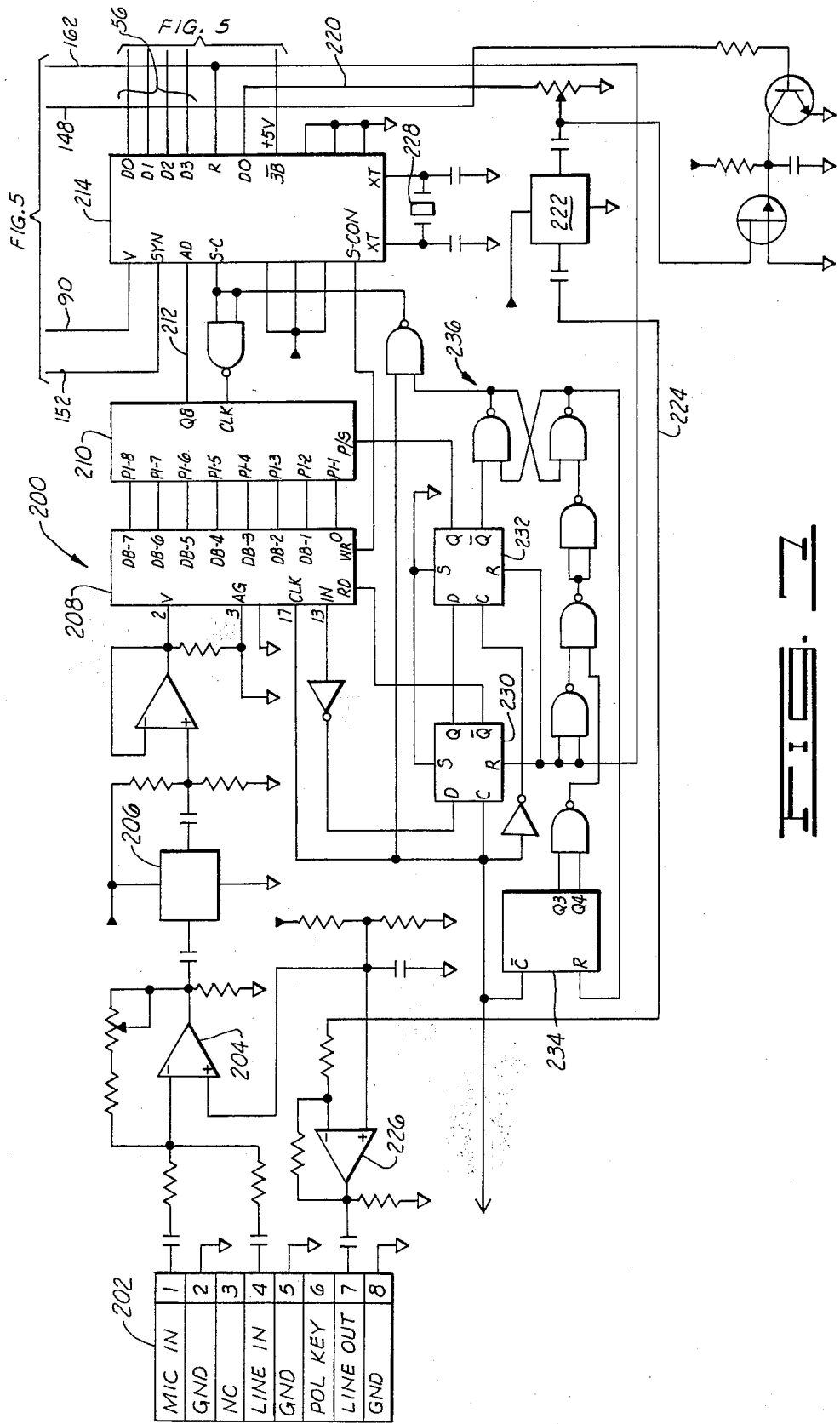

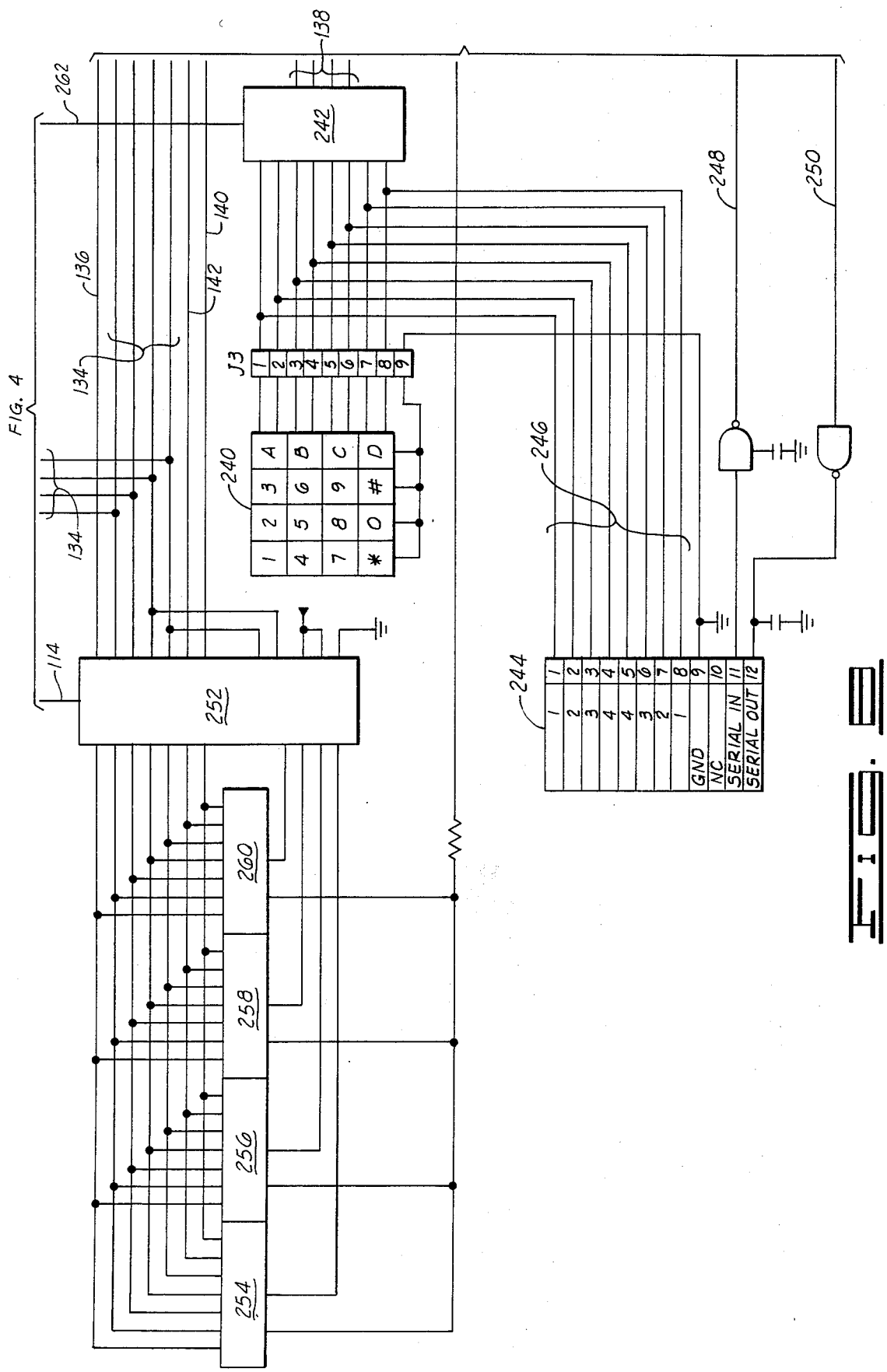

DIGITAL AUDIO MEMORY SYSTEM

BACKGROUND OF THE INVENTION

1. Field of the Invention

The invention relates generally to digital audio recording and playback systems and, more particularly, but not by way of limitation, to digital memory systems utilizing synchronized solid-state storage of the random access memory type.

2. Description of the Prior Art

The prior art includes a number of different types of apparatus for carrying out recording and playback of audio information or data utilizing solid-state storage facility. The basic concept of digitization of audio signal energy with subsequent storage in random access memory or the like has been available for some time, and this form of audio recording has been utilized in various forms of equipment; however, applicant knows of no digital audio recording system that functions in the manner of the present invention and makes available a heretofore unachievable capacity of storage that is subject to instantaneous selection and playback in any of various lengths of message or presentation.

SUMMARY OF THE INVENTION

The present invention relates to a high quality solid-state audio memory system that enables instant access audio from an array of solid-state storage devices capable of compound application to constitute an unusually large storage capacity for the particular type of storage. The system has a control section that includes a microprocessor and control logic circuitry as well as audio input and output circuitry. The control section provides input and output control to a solid-state memory section that may be constituted variously depending upon the amount of storage capacity desired. The basic memory card utilizes 64K×1 random access memory (RAM) circuits in an array of ten groups of four RAMS each to provide ten seconds of audio storage in each group. There can then be connected a multiple of ten such groups per memory card and ten such memory cards in a single unit. Further storage capacity is provided by the addition of up to seven slave units, each having similar capacity, such that with proper selection of digital clocking frequencies a full capacity system may have up to 8,000 seconds of storage, i.e. 2.222 hours of stored audio message selectable in whatever the desired order and incremental lengths.

Therefore, it is an object of the present invention to provide a digital audio memory and playback system that has excellent fidelity sound reproduction with extreme rapid access message capability.

It is also an object of the invention to provide an audio record/playback system that enables instant access to any of a number of pre-recorded messages having lengths from one second up to the full capacity of the storage array.

It is yet another object of the present invention to provide a record/playback digital system that can also be utilized for remote controlled selective message dissemination and message synthesis.

It is still further an object of the present invention to provide a digital message record/playback system that is extremely versatile in operation as it utilizes relatively simple logic in order to control a massive random access memory system.

Finally, it is an object of the present invention to provide a basic solid-state storage/playback system having instant access and variable message length capabilities while still offering simple yet relatively large system expandability by compounding of memory bank units.

Other objects and advantages of the invention will be evident from the following detailed description when read in conjunction with the accompanying drawings which illustrate the invention.

BRIEF DESCRIPTION OF THE DRAWINGS

FIG. 4 is the timing section of the control board of the present invention;

FIG. 5 is a schematic drawing of the microprocessor portion of the control board;

FIG. 6 is the refresh control section of the control board;

FIG. 7 is the audio section of the control board; and

FIG. 8 is a schematic of the input control and indication circuitry of the control board.

DETAILED DESCRIPTION OF THE INVENTION

Figure 1:
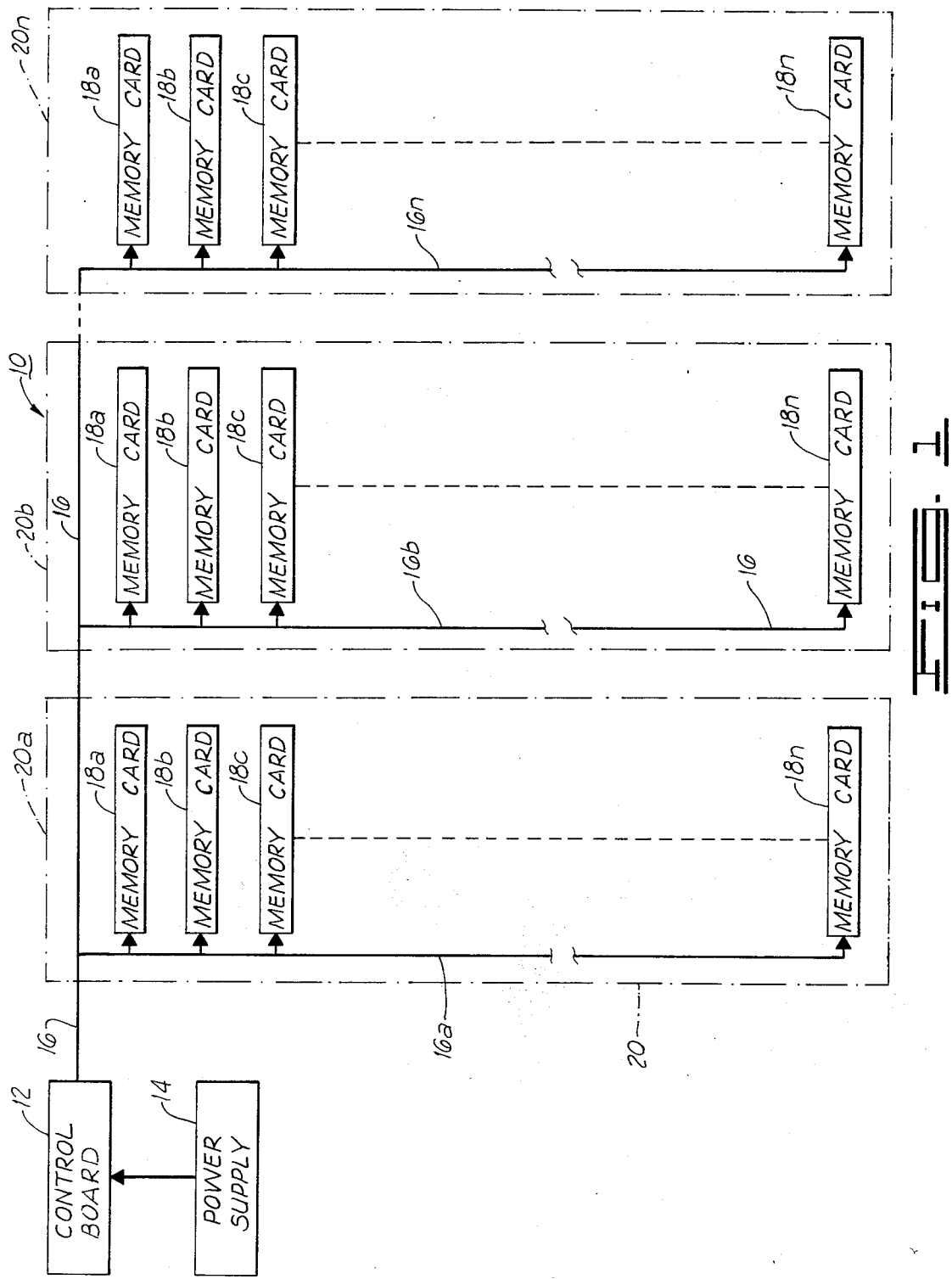
FIG. 1 is a block diagram of the recorder system.

Referring to FIG. 1, the digital message system 10 consists of a control board 12 as energized by a suitable power supply 14 of known design. The control board 12 includes the circuitry as shown on the schematic diagrams of FIGS. 4–8, as will be further described. Output via multi-conductor cable 16 is then applied to a selected plurality of memory boards or cards 18 as arrayed in selected manner. Thus, cable 16a is applied to a memory unit 20a for parallel connection to each of a plurality of memory cards (boards) 18a–18n. As used herein, the subscript n is used to denote some unknown number in a series. In present design, each memory card 18 consists of ten groups of four random access memory devices, forty in all, as will be further described. Also, as presently designed, as many as ten memory cards 18a–18n may be compounded in parallel in each memory unit 20.

Thus, a complete functioning unit may be made up of a single control board 12, power supply 14 and storage unit 20 having a selected array of memory cards 18a–18n. Message capacity can then be further enlarged by compounding of slaved message units 20b–20n as connected to parallel cable connections 16b–16n. Here again, present design allows for slaved connection of as many as seven additional message units 20, this making eight message units in the total system, and each message unit 20 is similarly comprised of up to ten memory cards 18a–18n. The individual memory devices used on each memory card 18 are dynamic random access memory chips (hereinafter "DRAM") each having 64K×1 capacity. Each memory card 18 consists of ten groups of four DRAMS each amounting to 40 DRAMS per memory board. Static RAMS could of course be used to good advantage, but the attendant increase in cost would probably outweigh any advantages to be gained. In present design, each memory board is made up of a plurality of Type MB8264 DRAM.

The intent is to provide ten seconds of audio storage in each memory group of four DRAMS, and since the particular scheme of audio digitizing chosen for this system is the adaptive pulse code modulation method (ADPCM) resulting in four-bit audio words, 40 memory elements are required for the target capacity of 100 seconds (ten groups) per memory card 18. Each DRAM group is arranged for parallel output to yield four-bit data from a common clocking scheme. Since the rounded-off binary term of 64K in actuality means 65,536 memory cells are contained in each DRAM, a clocking rate of 6553 hertz will result in ten seconds of four-bit data from each group. The groups are clocked in sequential order thereby to accomplish a continuous stream of four parallel bits for 100 seconds. This scheme is extended to each successive memory card 18b–18n, and continues sequentially through each successive slave unit 20b–20n connected in the system up to the maximum of eight units. Thus, the maximum capacity will have $10 \times 10 \times 10 \times 8$ which is equal to 8,000 seconds. This forms a continuous system for transmission of data into or out of the memory based upon a real-time clocking rate of 6553 hertz, and resulting in a data transmission rate of 26.212K bits per second.

Figure 2:
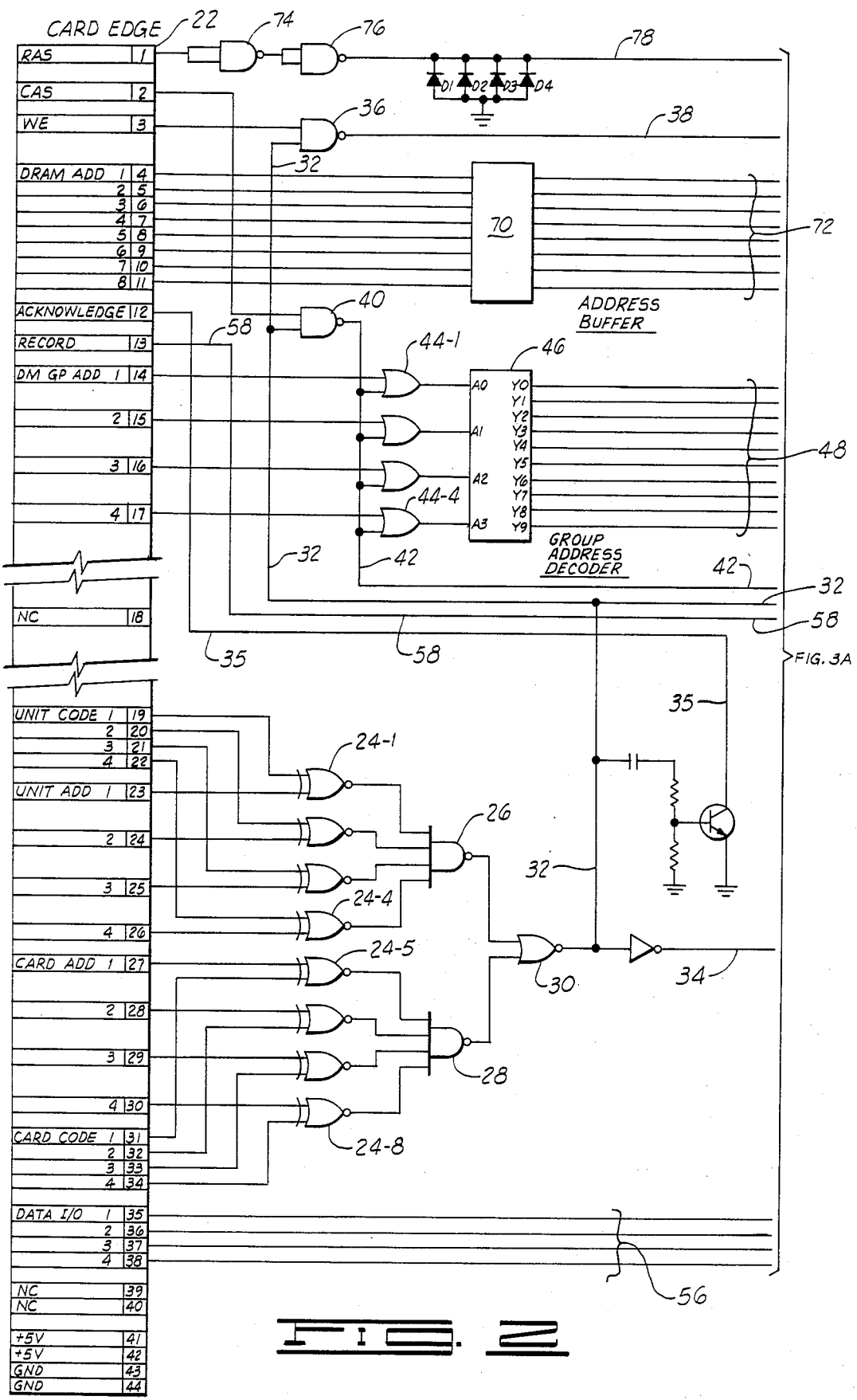
FIG. 2 is a schematic diagram of the input section of a memory card.
Figure 3A:
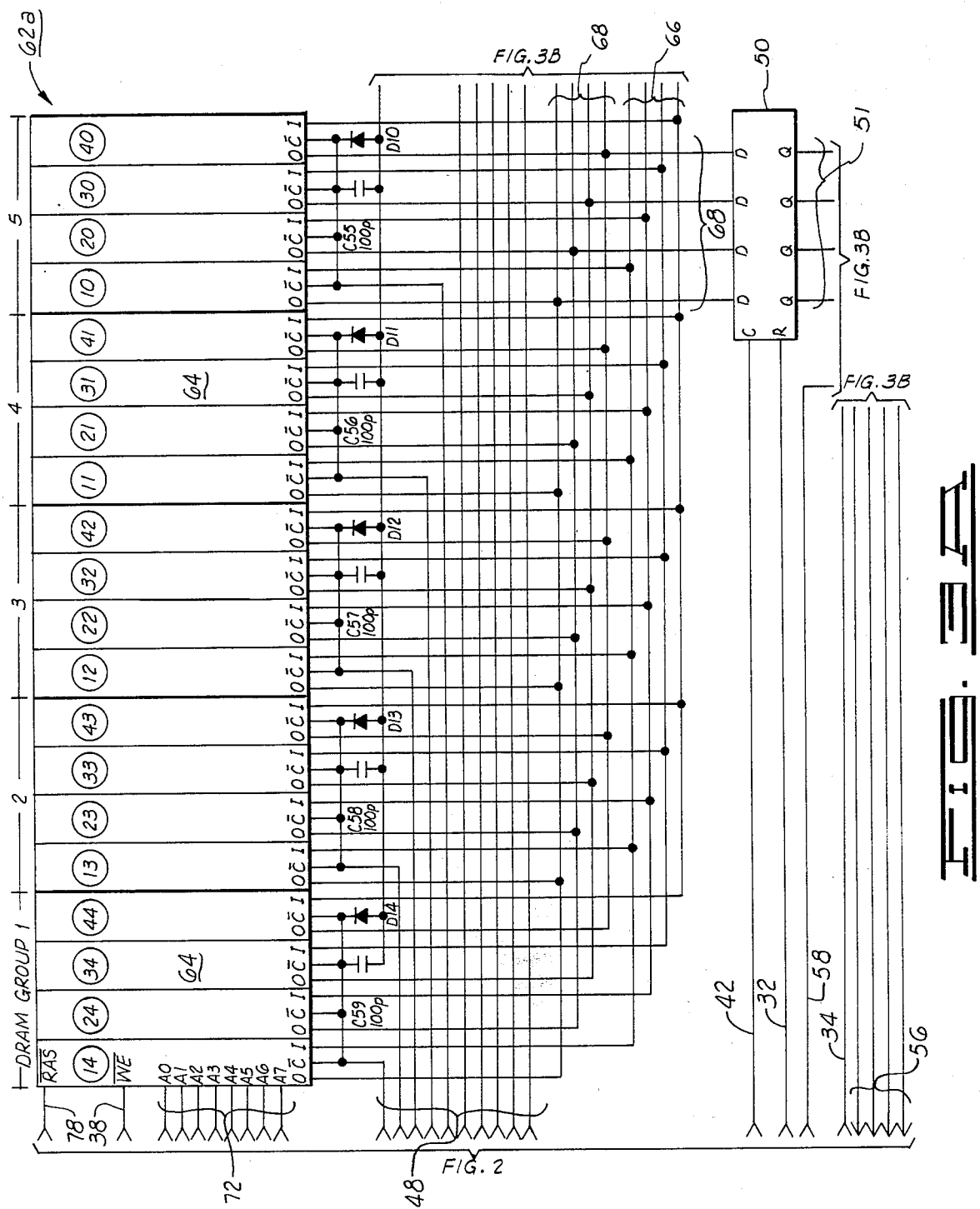
FIG. 3A a schematic drawing of one-half of the storage section of a memory card.
Figure 3B:
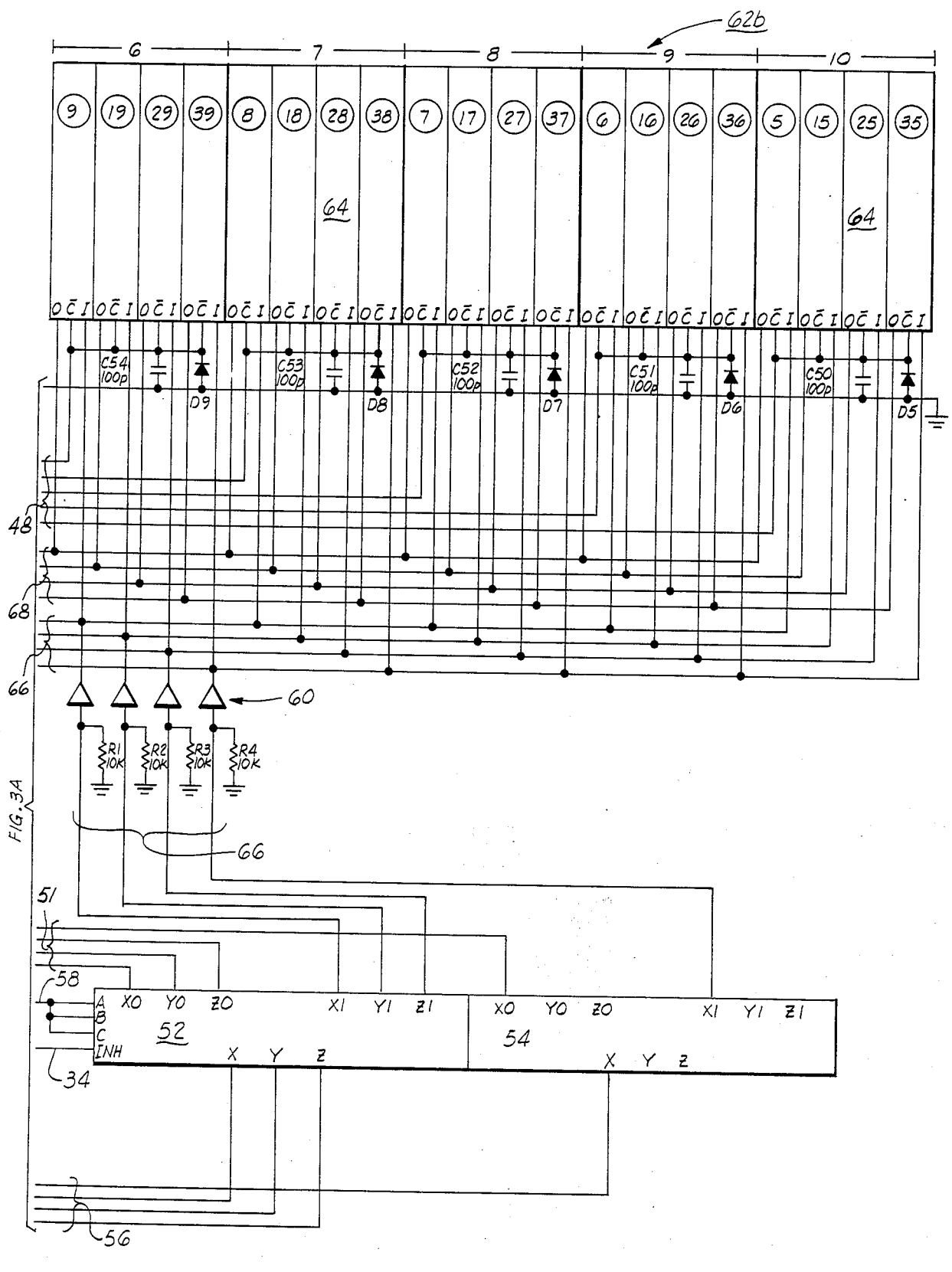
FIG. 3B is a schematic drawing of the remaining half of a storage section of a memory card.

Each memory card 18 includes circuitry as schematically shown in FIGS. 2, 3A and 3B as all input and output connections thereto are made through a card edge connector 22 at the input logic (FIG. 2) of memory unit 20. Connector contacts Nos. 19–34 provide unit and card address decoding input to a plurality of exclusive NOR gates 24-1 through 24-8. Thus, four-bit unit code is applied with respective four-bit unit address through gates 24-1 through 24-4, and outputs are applied to a triple gate 26. In like manner, four-bit card address and card code inputs are applied to respective gates 24-5 through 24-8 with output through a triple gate 28. Final output through triple gates 26, 28 is then applied through OR gate 30 to provide an output on lead 32 as well as through an inverter to a lead 34. The gates 24 are comprised of quad exclusive NOR gates Type 14077 and the gates 26, 28 and 30 are contained on an IC Type 14501 triple gate. The gates are configured to cause activation of the particular memory card 18 when proper unit and card addresses are received from the control board 12. That is, the data set up on the system address buss is then compared to a hard-wired code provided at the mother board (not shown) connection for that particular card. If both the unit and card addresses agree with the identifier code, then a logic high will be outputted on lead 32 to enable the remainder of the circuits on the particular memory card 18, and a pulse on lead 34 is conducted as an inhibit pulse to an analog switch, as will be further described. Transistor output on lead 35 provides an acknowledge output via connector 22, pin 12 to the control board 12.

When a memory card 18 is inactive, lead 32 applied to NAND gate 36 prevents input of write enable (WE) signal from pin no. 3 of card connector 22 for input on lead 38 which is held at a logic high state as input to the DRAM bank (FIG. 3a). Also, an input to the column address strobe (CAS) control gate 40 is held low by signal on lead 32 causing the output on lead 42 to remain high thereby to disable any distribution of the CAS control to any of the DRAM groups through OR gates 44 and decoder 46, a BCD DECODER Type 74HC42. The gates 36 and 40 are contained on an IC Type 74HC00, quad NAND gate.

The DRAM group address decoder 46 determines which DRAM group will receive CAS control via control leads 48 when the board is active, this in accordance with the data on the DRAM group address buss (pins 14–17). When the memory card 18 is inactive, all inputs to this respective decoder 46 will be held high through OR gates 44, causing all outputs to also be high and this is the inactive state of the CAS control. When the CAS gate 40 is in the enabled state, a pulse on the system CAS buss 48 will be delivered to the DRAM group (FIGS. 3A, 3B) that is determined by the DRAM group address.

Referring to FIG. 3A, a data output latch 50 is held reset when the board is inactive by the condition of lead 32. Latch 50 is a Type 74HC32, quad OR gate. Latch 50 will latch when output data is received on leads 68 to provide output on leads 51 for a playback operation as enabled by the CAS pulse. This serves to provide stable data to the audio conversion circuit between memory access cycles, as will be further described.

Analog switch circuits 52 and 54 (FIG. 3B), each Type 14053, provide data input/output switching. The outputs of chips 52 and 54 are held in an OFF state when the board is inactive to provide isolation of the DRAMS I/O lines 56 from the system data buss, pins 35–38 at respective connector 22. When the memory card 18 is activated, the chips 52 and 54 serve to connect the data buss to either the output buss 68 of the memory DRAMS for a read operation, or to the input busses 66 of the memory DRAMS for a record operation, depending upon the state of the record buss 58 from card connector 22. A quad buffer 60, Type 74HC125, provides isolation for the DRAM inputs.

Referring now to FIGS. 3A and 3B together, each DRAM array 62 of each memory card 18 includes ten groups 64-1 through 64-10 of four DRAMS each as especially numbered by the circle/numbers identifying each DRAM in relationship to the input, output and CAS busses 66, 68 and 48, respectively. Each of the DRAM units 64-5 through 64-44 is a $64K \times 1$ DRAM Type MB264.

Referring again to FIG. 2, a DRAM address buffer 70, an IC Type 74HC245 octal tri-state buffer, receives input of pins 4–11 of connector 22, the system DRAM buss, and buffers an output 72 to the DRAM 64 of a respective memory card. Series-connected gates 74, 76, quad NAND gates Type 74HC00, serve as a non-inverting buffer for the row address strobe (RAS) input line from pin 1, connector 22 to the RAS input line 78 to the DRAMS 64.

The control board 12 (FIG. 1) is made up of the circuitry represented in FIGS. 4, 5, 6, 7 and 8. FIG. 4 includes the basic timing circuitry consisting of an oscillator stage 80 controlled by a crystal 82 to provide a timing output of 1.677568 megahertz via lead 84. Input from lead 84 to IC 86 develops the various clock frequencies used with the system as well as the synchronized short duration pulses that are necessary for RAS and CAS control. The IC 86 is a dual binary counter Type 14520 and functions to provide a first output at 419.392 kilohertz at the Q2 output on lead 88, and it also generates the 6553 hertz clock at Q4 on lead 90.

A NOR gate 92, IC Type 74HC4078, provides output of a 1.192 microsecond duration pulse for input to the RAS and CAS control circuitry, as will be further described. This pulse is synchronized with the onset of the low state of the 6553 hertz clock used for the basic access transmission rate as it is applied through an AND gate 94. A PAUSE on lead 96 is also applied to AND gate 94 to generate the subsequent output on a lead 98.

An integrated circuit 100, a Type 74HC42 one of ten decoder, functions as an LED indicator decoder as it outputs a low on one of the Y outputs that corresponds to the BCD code presented at the four-bit input A0–A3. The high order bit of the four-bit input is inverted by inverter 102, and the output lines chosen for the functions to be displayed are such that the state of the Port 1 data lines, P0–P3, from IC down counter 104, can never cause a function display to occur unless purposely coded. The counter 104 is an IC Type 145156, UP/-DOWN binary counter, that is held normally reset until a preset enable pulse is input on line 106. When the PE pulse is present on lead 106, reset is removed and the counter 104 is preset to the LSD of the address thereby to cause a high to appear at the CO output 108. Output on lead 108 further disables the reset circuit of counter 104 and enables high speed clocking of the DRAM address counters through the NAND and AND 182 logic that it feeds (FIG. 6), as will be further described.

A counter 110, Type 14020 14-bit binary counter, is configured to receive clock pulse input on lead 112 to divide by 6553 as the Q ports function with a dual four AND circuit 113, Type 14082, to provide one-second pulses on lead 114. Pulses on lead 114 are applied to the count input of IC 104 as well as back through the OR gate 116 as reset input to IC 110. A stop pulse (to be described) on lead 118 is also applied to OR gate 116.

Referring now to FIG. 5, the control board 12 includes a microprocessor 120, a Type MK38P73. This type of microprocessor is readily adaptable to the present type system, mainly because of the input/output port configuration using internal pull-ups and output latches, dual mode port lines, and ease of interfacing with CMOS logic. Microprocessor 120 also includes a serial port that is particularly useful for the system's remote connection interface, and it further includes internal clock generator at 3.6864 megahertz, 64 internal registers, 64 bytes of executable RAM, and up to 4K of PROM.

The port P0 is assigned with bits P0-4 through P0-7 applied through buffer 124 to output leads 126 to provide BCD card address at pins 27–30 of card connector 128. When the system is in STOP condition, lines 126 are all set high to disable all cards in the system. The lower bits P0-0 through P0-2 are also applied through buffer 124 and leads 130 carry the BCD unit address data as applied to pins 23–25 of card connector 128. The bit P0-3 is buffered and applied on a lead 132 for use in outputting decimal point illumination at the system display, as will be described.

Port 1 connections only provide for access to the upper five bits P1-3 through P1-7 since the pins normally used for the lower three bits serve as the serial port connections. The bits at P1-4 through P1-7 on leads 134 are used for I/O interface with the display control/-counter (FIG. 8). These bits are also output to the indicator decoder chip 100 and the starting address down counter 104 (FIG. 4). Lines 134 are normally low or in some state determined by the indicator code, but they are carried high for input functions. Bit P1-3, as output on lead 136, is applied as output to the display/counter control (FIG. 8) data transfer strobe as an indication when four digits of data are loaded into the counter, and when data is read from the counter.

Port 4 of microprocessor 120 is continually scanned for input when the processor is not actively executing a function. All lines except bit P4-0 are used for input purposes and all are normally high. Bit Nos. P4-4 through P4-7 are used for input from the control key pad (FIG. 8) on four-bit lines 138, either row or column, as will be described. The bit at P4-3 is the EQUAL input on a lead 140, and this input becomes active low when the signification of a stopping address has been reached by a display/counter chip (FIG. 8). The bit Nos. P4-1 and P4-2 may be used to signify the mode selector switch position, and bit P4-0 on lead 142 provides output for the control word strobe (CWS) to the display/counter chip (FIG. 8). The four-position mode switch 141 selects between NORMAL, PROGRAM, CONTINUOUS SEQUENCE, and INTERRUPTED SEQUENCE.

At port 5 of microprocessor 120, P5-7 is applied through a buffer 144 to the output lead 146 to control the reset of the DRAM address counters, and also to indicate a STOP condition at LED 147. This lead 146 is low at the start of and during a memory access operation. Bit P5-6 is similarly buffered and output on lead 148 to drive an LED indicator 149 to indicate the PAUSE condition while it is also applied to enable a flip-flop 150, a Type 74C109 dual J-K flip-flop, to disable the audio conversion circuit and stop DRAM address clocking when triggered by a next 6553 hertz clock pulse. Active operations commence when bit P5-6 is low.

Bit P5-5 is a RECORD enable output as shown with switch 151 in the ON position, to be grounded for RECORD enable. The bit P5-5 output is also buffered and applied through a lead 152 to an LED indicator 154 as well as to pin 13 of card connector 128 and to FIG. 7 to set the audio conversion circuit for A/D operations.

Bit P5-4 is buffered and applied on a lead 156 as an output to control pre-setting of the down counter 104 (FIG. 4) for DRAM starting at the second tally called for by the inputted address LSD. This line is normally low. Bits P5-0 through P5-3 are buffered to provide the BCD DRAM group address via leads 158 to pins 14–17 of card connector 128.

Acknowledge signal from pin 12 of the card connector 128 is applied on lead 160 to the INT input of microprocessor 120. The flip-flop 150 is enabled in the PAUSE condition, active high, to provide a Q output on lead 162 to disable the audio conversion circuit, and counterpart output $\overline{Q}$ is applied on a lead 164 to stop DRAM address clocking, as will be described.

Referring more particularly to FIG. 6, a Type 14526 divide by N binary counter 170 functions as the DRAM refresh control counter. The counter 170 receives input of clock pulse on lead 90 and outputs a logic high pulse of 76.3 microseconds duration (the high state of the 6553 hertz clock) every 13th clock pulse, and this provides a repetition rate of 1.983 milliseconds for the refresh operation. During this pulse, a refresh row address counter 172 is enabled to be clocked by input from lead 84 (1.677568 MHz) to effect cycling through all 128 row addresses before disabling the operation. During this interval, the DRAM address lines 176 are connected to the refresh row address counter outputs 174 by complementary switching of the buffers 178 and 180. Buffers 178 and 180 are each Type 74HC241 octal tri-state buffers. This interconnection takes place while the counter is not reset and while the RAS line is enabled for 1.677568 megahertz pulses on line 84. This process allows the refresh operation to be independent of the normal memory access operation, and to occur between access operations at 1.983 milliseconds intervals.

When an operation is commenced, a high from the PAUSE control flip-flop 150 (FIG. 5) on lead 164 enables the NAND/AND logic 182 at the clock input of the DRAM row address counter 184 while further enabling the RAS/CAS control through the remaining AND gates. The DRAM column address counter 186, Type 14020 14 bit binary counter, then receives clocking from the last stage Q4 output of the row address counter 184, thereby changing the column address each time the row address counter cycles completely through all 156 positions. The address changes occur with the onset of the high state of the 6553 hertz clock.

A RAS pulse occurs on lead 185 when the 6553 hertz clock goes low to strobe the row address into the DRAMS. A short logic delay later, complementary switching of the address counter tri-state buffers 188 and 190 will transfer the column address lines to the DRAM address buss 192, and a CAS cue pulse on lead 194 will occur to strobe the column address into the DRAMs. When the RAS/CAS cue returns to the normal state, the address buffers are switched back to re-enable the row address connections from buffer 188 to the DRAM address buss. REFRESH ouput on lead 171 from IC 170 provides switching of row address buffers 178 and 180, and inverted output from NAND gate 192 via lead 194 provides switching of column address buffers 188 and 190.

FIG. 7 illustrates the audio record/playback circuitry as contained on control board 12. The audio circuitry 200 is a conventional type using adaptive differential pulse code modulation (ADPCM) method of data compression thereby to reduce as much as possible the number of bits of data that have to be stored while still preserving good audio quality. Circuitry portion 200 is connected by leads 56 to the card connector 128 (see FIG. 5) and audio output/input and control is effected through an audio connector 202. Circuitry 200 constitutes suggested design of the manufacturer of the primary integrated circuits involved, i.e. OKI Semi-Conductor, Inc. The ADPCM method uses an A/D converter 208 to convert the audio into parallel eight-bit words, which are then converted to a serial stream through a parallel-to-serial shift register 210 for presentation to a special analysis/synthesis circuit 214 that analyzes the eight-bit data, compresses it to four-bit data and then clocks it out to the four line data buss at the 6553 hertz clock rate for storage in memory. Thus, audio input is applied through an amplifier 204 and Type ALP-2 filter 206 for amplified input to the VIN input of eight-bit A/D converter 208, Type MSM5204R, and digital output from converter 208 is applied to an eight-bit shift register 210, Type 14014. Output from shift register 210 is then clocked out on lead 212 to the ADSI input of the Type MSM5218R ADPCM analyzer/synthesizer 214. Four-bit digital audio is then clocked out on lead 56 for storage in a selected memory card location.

In the playback mode, data is recovered from memory and input on leads 56 for input to the analyzer/synthesizer 214. The four-bit data is then synthesized back into an eight-bit word and converted back to audio through a D/A converter for output via lead 220 through a Type ALP-2 filter 222 and lead 224 for input to amplifier 226. The amplified output is then applied through pin 7 of connector 202, the line out connection. The chip 214 includes resident clock oscillator connections for use with crystal 228, e.g., 384 kilohertz. Support logic such as integrated circuit flip-flops 230, 232, seven-bit binary counter 234, and NAND gate network 236 function in support of the analysis/synthesis operation in accordance with prior established methods.

Referring particularly to FIG. 8, the keypad 240 provides digital input control. The microprocessor 120 (FIG. 5) continually scans port 4 by repeatedly inputting the data on the lines and testing each of the upper five bits for a logic low. When one of the upper four lines 138 is found low, the processor goes into an internal loop for 25 milliseconds and again inputs the data lines and analyzes each line to see if a low still exists. If a low is confirmed, the data is stored temporarily and a code is output from port 1 on lines 134 to cause the indicator decoder 100 (FIG. 4) to output a low to the key pad analog switch 242, Type 14551, to switch from column to row inputs, and input scan is again performed at port 4 of microprocessor 120 to see which row line is now low as a result of a key of key pad 240 being depressed. The data is stored and the processor 120 consults a look-up table to determine the binary code represented by the row and column combination detected. The code is analyzed to determine if a BCD number command was inputted, and if it is a digit it is stored in a set of internal registers as the first of a four-digit number.

If it is a command code, the operational conditions are checked to see if the command specified is allowed at that time, and action is executed accordingly. After the entry is processed, an output is made to port 1 to restore the key pad analog switch 242 to the normal column connections and the scan operation is resumed to detect button release at key pad 240.

If a low is detected on the EQUAL line (bit 3), the microprocessor 120 checks the operation status and if appropriate, halts the operation in progress by outputting highs on the card address lines of port 5 to disable the memory card involved. Microprocessor 120 then outputs highs on bits 6 and 7 of port 5 with a low on bit 5 of port 0 to disable record enablement, DRAM addressing, and the audio conversion process.

A card connector 244 provides for key pad input from a remote location as lines 246 are paralleled into the analog switch 242. Pins 11 and 12 are connected through respective NAND gates to the SI and SO contacts of microprocessor 120 (FIG. 5) via lines 248 and 250. Alternatively, the system may be connected to a standard RS232C interface.

An IC 252, Type ICM7227A1 four digit driver/counter, receives input on leads 134, 136, 140 and 142 from microprocessor 120 (FIG. 5) to perform a primary function of driving the four-digit display as represented on IC's 254, 256, 258 and 260. IC 252 receives a clock pulse on lead 114, one second pulses, as output from the gate circuit 112 (FIG. 4), and control input to analog switch 242 is received on lead 262 from port Y2 of decoder 100.

In operation, all DRAMS are addressed via the same address buss and distinguished by the RAS or CAS controls. For normal access to memory for read or write operations, the common address lines are switched to different sources by external circuitry and the procedure chosen is to have separate binary counters for the row address and column address sources. The row address counter 184 (FIG. 6) is clocked at the transmission rate and the column address counter 186 is clocked each time that the row address counter 184 completes a cycle through all addresses. These counter outputs are connected alternately to the DRAM address buss 192 through tri-state buffers 180, 188 and 190. Thus, one column address is common for all 256 row addresses.

All DRAMS in the system are driven from a common address buss 192 that is buffered on each memory board. The RAS line is also a common system buss buffered on each memory board 18 to all DRAMS. The CAS lines control the DRAM access for data operations, and are separate for each DRAM group in the system. The read/write control is common to all memory boards 18 in the system, but it is enabled separately when each board is independently activated. The data input lines from the four DRAMS in each group (FIGS. 3A and 3B) are commoned onto a four-line buss in each memory board 18 and are connected through buffer 60 and analog switches 52, 54 to the common system four-line data buss 56 when the memory board 18 is selected for a recording operation.

Data output from the four DRAMS in each group on a memory board 18 are commoned onto another four-line buss in each memory board 18 and are connected through a latch 50 and analog switches 52, 54 to the common system four-line data buss 56 when the memory board 18 is selected for a playback operation.

Memory bank addressing requires four digits for addresses. The numbers must be between 0000 and 7999 to address any location in the memory. Each increment of the address is equal to one second of memory space and each of the four digits represents something different to the microprocessor in the system. That is, the first digit identifies the unit number in the system (8 units per system), the second digit is the card number in the particular unit (ten cards per unit), the third digit is the RAM group on that card (ten groups per card), and the fourth digit is the position in the RAM group (ten seconds per RAM group). This assumes a maximum capacity system including the master memory unit/control unit and seven slave units. Lesser arrayed units would have a relatively smaller number range.

Thus, the address contains indentification of the unit, board (card), DRAM group and position in the DRAM group, as determined by decimal numbers. In an inactive state, the board address is held out of decimal range by microprocessor application of hex code F, which disables all boards. When a board is inactive, it disables the DRAM group address input to the board, to disconnect the CAS control to the memory bank on the board. Also, the DRAM address counters are held reset so that the DRAMS will always be started at their first cell position.

The microprocessor 120 receives address entries either through the keypad 240 or a remote port connection 244. When an operation is commenced, the microprocessor 120 first removes the reset from the DRAM address counters 184, 186 and this enables a pre-positioning of the counters to an address that is proper for the seconds called for by the inputted address least significant digit (LSD). This is accomplished with control logic that creates a pulse from the DRAM address counter 186 each time 6553 clock pulses are inputted to the row address counter 184, this representing one-second increments of memory.

The logic also involves utilizing a down counter 104 which is preset to the LSD of the inputted address and enables a 1.677568 megahertz clocking input to the address counters 184, 186. The address counters are then clocked at the high-speed rate to output the one-second position pulses on line 114 which clock the down counter 104 until the preset position is reached. When the counter 104 has been counted down by the number of one-second pulses required to satisfy the DRAM position requested by the LSD of the inputted address, it stops the process and the DRAM address counters 184, 186 are held at that starting position until other parts of the address have been set-up and acknowledged to commence operation.

The mother board (not shown) includes hard-wired connections for each memory card that sets-up a unique four-bit unit address code for that particular card, as well as a code for the particular card unit that contains the card. Each memory card 18 receives address input from the common address busses and compares the addresses from the busses with the code addresses obtained from the mother board position connections. If the comparison is equal, the board can be activated for the operation and sends an acknowledge cue to the microprocessor 120 by a lead 35, 160. When microprocessor 120 receives the acknowledge cue, it enables the clocking of the DRAM address counter 184, 186 and the output of RAS and CAS pulses to the memory bank, and enables the DRAMS and audio conversion circuit 200 for the read or write function to be carried out.

Operation cannot commence without an acknowledge cue, and if microprocessor 120 does not receive such cue on lead 160 within two milliseconds after the addresses are enabled, the software presumes that either the card specified is not plugged in or that the unit specified is not connected, and a code is output to the display system that warns "not available". Entry then has to be restarted with an appropriate address.

Since the memory organization is continuous, there is included a method of recognizing the end of a message or recorded segment during playback. Thus, the system includes a scheme that provides for a closely controlled window operation wherein two sets of addresses must be set up before an operation can commence. Therefore, the rules of operation require that two sets of four digits (in the full unit case) must be entered into the system, one for a starting address and the other for an ending address, equivalent to seconds storage time.

The system includes a four-digit display 254-260, which is driven by a special integrated circuit driver/counter 252 that functions as a presettable up/down counter and which also includes a presettable internal register and comparator system to output a cue when the internal register contents are equal to the counter's content. This chip is configured for up counting, and the display 254-260 always indicates the counter content.

When an operation is commenced, the entered stopping address is loaded into the digital register, and the starting address is preset into the counter of counter 252. As the operation proceeds, the one-second pulses obtained from the down counter 110 are used to clock the counter 252 which increments the display every second of running time throughout the operation. When the displayed address equals the preset stopping address in the internal register of counter 252, the chip will output an EQUAL cue to port P4-3 input of the microprocessor 120. When an EQUAL input is encountered by scanning of port 4-3, microprocessor 120 will halt the operation, disable the audio conversion system and the DRAM addressing, reset the DRAM address counters 184, 186, and output a code to the indicator system to illuminate the "STOPPED" LED 146.

The foregoing discloses a novel type of digital memory system that provides rapid access recording and playback of audio messages as selected from an inordinately large storage capacity, and the system is capable of providing excellent fidelity sound output. The system utilizes dynamic random access memory integrated circuits and performs refresh control for an entire memory unit that may include a compound system of slave units giving up to 2.222 hours of audio message time. The microprocessor control system enables instant access to any part of the addressable memory from one second up to the full capacity, and it has window capability to record or playback selected time segments.

Changes may be made in combination and arrangement of elements as heretofore set forth in the specification and shown in the drawings; it being understood that changes may be made in the embodiments disclosed without departing from the spirit and scope of the invention as defined in the following claims.

What is claimed is:

1. Apparatus for storage and retrieval of audible information, comprising:
    control means that includes, timing means generating a basic timing pulse at a selected frequency, counter means responsive to said timing pulses to generate a random access memory address code output, and a microprocessor receiving code input indicating information memory location in storage and outputting at least a memory group address code output;
    memory card means that includes plural memory groups of random access memory means arrayed in parallel wherein each of said memory groups consists of an equal number of said random access memory means, means connecting said random access memory address code output to control ports of each of said random access memory means, decoder means receiving said memory group address code output to enable a selected one of said plural memory groups of random access memory means, and input/output means selectively connected to respective random access memory means of a selected memory group; and
    audio means including first converter means for digitizing audio for input to said input/output means for storage at a selected random access memory location, and second converter means for receiving digital data output form a selected random access memory location and outputting analog audio signal for audible output.

2. Apparatus as set forth in claim 1 wherein:
    there are four random access memory means in each group.

3. Apparatus as set forth in claim 1 wherein said audio means further comprises:
    analyzer/synthesizer means for effecting adaptive differential pulse code modulation.

4. Apparatus as set forth in claim 1 which further includes:
    keypad selection means manually operable to output a binary coded decimal output indicative of information memory location for input to the microprocessor; and
    display means corresponding to said information memory location.

5. Apparatus as set forth in claim 4 wherein:
    said numbers equate to real time designation of the total available time in the memory card means.

6. Apparatus as set forth in claim 1 which further includes:
    at least one additional memory card means connected to said control means in like manner;
    a first card address code output from said microprocessor indicating a selected one of the memory card means; and
    decoder means on each memory card means receiving said card address code output to provide a card enable output to enable the selected memory card means.

7. Apparatus as set forth in claim 6 which further includes:
    a plurality of slave units with each such unit consisting of plural memory card means connected to said control means in like manner;
    a second unit address code output from said microprocessor indicating a selected one of the slave units; and
    second decoder means on each memory card means receiving said second unit address code output to provide a unit enable output to enable the selected slave unit.

8. Apparatus as set forth in claim 7 which further includes:
    keypad selection means manually operable to output a binary coded decimal output indicative of information memory location for input to the microprocessor; and
    display means corresponding to said information memory location.

9. Apparatus as set forth in claim 8 wherein:
    said numbers equate to real time designation of the total available time in the memory card means.

10. Apparatus as set forth in claim 7 wherein:
    there are as many as ten groups of random access memory on each memory card means, and as many as ten random access memory card means on each unit, and as many as eight units responsive to said control means.

11. Apparatus as set forth in claim 10 wherein:
    there are four random access memory means in each group.

12. Apparatus as set forth in claim 1 wherein the control means counter means further comprises:
    a binary counter counting down said timing pulse to provide a clock pulse at a selected rate;
    a row address counter responsive to said clock pulse to generate row address output;
    a column address counter that is clocked each time the row address counter completes a row address cycle to generate a column address output; and
    tri-state buffer means controlled at a selected switching rate to alternately connect the row address output and the column address output to a random access memory address buss to said memory card means.

13. Apparatus as set forth in claim 12 wherein:
    said clock pulse rate is 6553 Hertz.

14. Apparatus as set forth in claim 12 which further includes:
    a dividing counter counting a clock pulse input and generating a refresh pulse of selected pulse width;
    a refresh counter response to said timing pulses to generate an alternate source of second row address output pulses; and tri-state buffer means controlled during said refresh pulse to switch said second row address output pulses to said random access memory address buss at a selected multiple of said clock pulse rate.

15. Apparatus as set forth in claim 14 wherein:
said clock pulse rate is 6553 Hertz and said basic timing pulse has a frequency of 1.677568 Megahertz.

16. Apparatus as set forth in claim 12 which further includes:
gate means responsive to said timing pulse and said refresh pulse to generate a periodic row address strobe for input to said random access memory means.

17. Apparatus as set forth in claim 16 which further includes:
gate means responsive to said clock pulse and said refresh pulse to generate a periodic column address strobe input to the memory card means to enable said memory group address code for input to said decoder means.

18. A method for recording and playback of selected segments of audio information, comprising:
defining a memory bank by connecting a plurality of similar random access memory devices as at least one unit having plural memory cards, each memory card consisting of a plurality of memory groups with each group having a preset number of memory devices with addressable locations;
addressing said memory bank in real time in one second increments wherein a first decimal input addresses a selected unit in the memory bank, a second decimal input addresses a selected memory card in the unit, a third decimal input addresses a selected group on the card, and a fourth decimal input addresses a selected location in the group;
enabling selective storage and playback of data from the addressed location of the memory bank; and
effecting selective analog/digital and digital/analog conversion of data for respective storage and playback functions.

19. A method as set forth in claim 18 wherein:
a storage access time window may be defined by first selecting a start address of first, second, third and fourth decimal inputs and subsequently entering a stop address of first, second, third and fourth decimal inputs.

20. A method as set forth in claim 18 wherein:
the memory bank may include up to 10 seconds storage per group, up to 10 groups per card, up to 10 cards per unit, and up to 8 units per bank to provide a total of up to 8000 seconds of selectively addressable digital storage.

21. A method as set forth in claim 18 wherein:
each group consists of a parallel array of memory devices that output four bit binary data under a common clock control.

22. A method as set forth in claim 21 wherein:
the memory bank may include up to 10 seconds storage per group, up to 10 groups per card, up to 10 cards per unit, and up to 8 units per bank to provide a total of up to 8000 seconds of selectively addressable digital storage.

* * * * *

UNITED STATES PATENT AND TRADEMARK OFFICE
CERTIFICATE OF CORRECTION

PATENT NO. : 4,813,014
DATED : March 14, 1989
INVENTOR(S) : Lawrence R. DeBell

It is certified that error appears in the above-identified patent and that said Letters Patent is hereby corrected as shown below:

Column 13, line 9, (claim 16) delete the numeral "12" and substitute the numeral --14-- therefor.

Signed and Sealed this

Fifteenth Day of August, 1989

*Attest:*

DONALD J. QUIGG

*Attesting Officer*    *Commissioner of Patents and Trademarks*